United States Patent
Koo et al.

(10) Patent No.: US 9,129,926 B2
(45) Date of Patent: Sep. 8, 2015

(54) DISPLAY DEVICE INCLUDING THIN FILM TRANSISTOR

(71) Applicant: Samsung Electronics Co., Ltd., Suwon-Si, Gyeonggi-Do (KR)

(72) Inventors: Bon Won Koo, Suwon-si (KR); Kyoung Seok Son, Seoul (KR); Hye Yeon Yang, Yongin-si (KR); Bang Lin Lee, Suwon-si (KR); Yong Wan Jin, Seoul (KR); Joo-Young Kim, Hwaseong-si (KR); Jeong Il Park, Seongnam-si (KR); Eun Kyung Lee, Seoul (KR); Ji Youl Lee, Seoul (KR); Ji Young Jung, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/090,520

(22) Filed: Nov. 26, 2013

(65) Prior Publication Data

US 2014/0252326 A1 Sep. 11, 2014

(30) Foreign Application Priority Data

Mar. 5, 2013 (KR) ........................ 10-2013-0023542

(51) Int. Cl.
*H01L 35/24* (2006.01)
*H01L 27/32* (2006.01)
*H01L 27/12* (2006.01)

(52) U.S. Cl.
CPC ........ *H01L 27/3262* (2013.01); *H01L 27/1214* (2013.01); *H01L 27/1251* (2013.01); *H01L 27/1259* (2013.01); *H01L 27/3274* (2013.01)

(58) Field of Classification Search
CPC ............ H01L 51/0541; H01L 51/0545; H01L 51/0036; H01L 51/5012; B82Y 10/00
USPC ............................................ 257/40, E51.001
See application file for complete search history.

(56) References Cited

U.S. PATENT DOCUMENTS

| 6,528,816 | B1 | 3/2003 | Jackson et al. |
| 7,479,673 | B2 | 1/2009 | Jang et al. |
| 7,772,711 | B2 | 8/2010 | Noguchi et al. |
| 2005/0179061 | A1 | 8/2005 | Jang et al. |
| 2006/0267100 | A1 | 11/2006 | Noguchi et al. |
| 2008/0023728 | A1 | 1/2008 | Jang et al. |
| 2009/0090904 | A1 | 4/2009 | Lee et al. |

FOREIGN PATENT DOCUMENTS

| JP | 2009028669 A | 2/2009 |
| KR | 20050073956 A | 7/2005 |
| KR | 20060116540 A | 11/2006 |
| KR | 20080050965 A | 6/2008 |
| KR | 20090035869 A | 4/2009 |

*Primary Examiner* — Anthony Ho
(74) *Attorney, Agent, or Firm* — Harness, Dickey & Pierce, P.L.C.

(57) ABSTRACT

A display device according to example embodiments includes a first thin film transistor on a substrate, a second thin film transistor on the first thin film transistor, and a display unit electrically connected to at least one of the first thin film transistor and the second thin film transistor.

8 Claims, 4 Drawing Sheets

DISPLAY DEVICE INCLUDING THIN FILM TRANSISTOR

CROSS REFERENCE TO RELATED APPLICATION

This application claims priority under 35 U.S.C. §119 to Korean Patent Application No. 10-2013-0023542 filed in the Korean Intellectual Property Office on Mar. 5, 2013, the entire contents of which are incorporated herein by reference.

BACKGROUND (a) Field

Example embodiments relate to a display device including a thin film transistor.

(b) Description of the Related Art

A flat panel display, e.g., a liquid crystal display and an organic light emitting display, includes a plurality of pixels, and a pixel includes one or more thin film transistors. The number of the thin film transistors in a pixel of a display device may vary depending on a structure of the display device. For example, an organic light emitting display may include at least two thin film transistors including a switching thin film transistor and a driving transistor supplying an electric current for a light emitting layer.

An aperture ratio of a pixel may decrease as the number of the thin film transistors increases, and an area assigned to a pixel may be smaller as a resolution of a display device increases. Therefore, a relatively large number of the thin film transistors may have a negative impact on an image quality of the display device.

SUMMARY

According to example embodiments, a display device includes a first thin film transistor on a substrate, a second thin film transistor on the first thin film transistor, and a display unit electrically connected to at least one of the first thin film transistor and the second thin film transistor.

The display device may further include an insulating layer between the first thin film transistor and the second thin film transistor.

The first thin film transistor may include a first gate electrode on the substrate, a first gate insulating layer on the first gate electrode, a first semiconductor member on the first gate insulating layer, and a first source electrode and a first drain electrode on or under the first semiconductor member, the first source electrode and the first drain electrode spaced apart from each other.

The second thin film transistor may include a second gate electrode on the insulating layer, a second gate insulating layer on the second gate electrode, a second semiconductor member on the second gate insulating layer, and a second source electrode and a second drain electrode on or under the second semiconductor member, the second source electrode and the second drain electrode spaced apart from each other.

The first thin film transistor and the second thin film transistor may include a gate electrode in common, and the first thin film transistor may further include a first semiconductor member on the substrate, a first source electrode and a first drain electrode on or under the first semiconductor member, the first source electrode and the first drain electrode spaced apart from each other, and a first gate insulating layer under the gate electrode and on the first semiconductor member, the first source electrode, and the first drain electrode.

The second thin film transistor may further include a second gate insulating layer on the gate electrode, a second semiconductor member on the second gate insulating layer, and a second source electrode and a second drain electrode on or under the second semiconductor member, the second source electrode and the second drain electrode spaced apart from each other.

At least one of the first thin film transistor and the second thin film transistor may include an N-type or P-type organic semiconductor.

The display unit may further include an organic light emitting layer between two electrodes.

DETAILED DESCRIPTION

Figure 1:
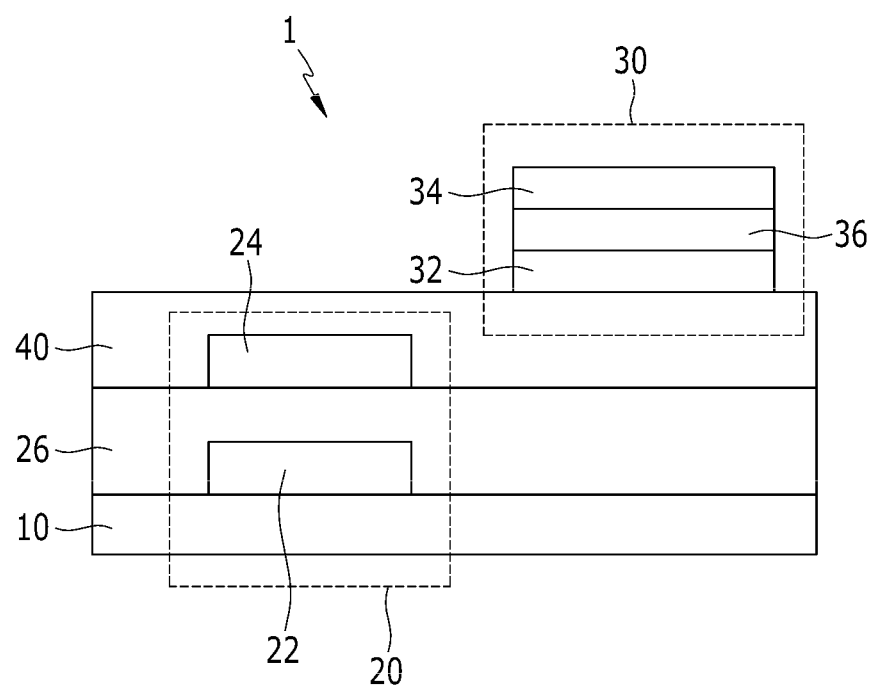
FIG. 1 is a schematic sectional view of a display device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted. In the drawing, parts having no relationship with the explanation are omitted for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A display device according to example embodiments is described in detail with reference to FIG. 1.

FIG. 1 is a schematic sectional view of a display device according to example embodiments.

Referring to FIG. 1, a display device 1 according to example embodiments may include a substrate 10, a thin film transistor ("TFT") member 20, and a display member 30. The TFT member 20 and the display member 30 may be disposed on the substrate 10. The display device 1 may further include an insulating layer 40 insulating the TFT member 20 from the display member 30.

The substrate 10 may include a transparent insulating material, for example, a plastic, glass, and quartz. According to example embodiments, the substrate 10 may include a flexible material, e.g., a plastic. However, a material for the substrate 10 is not limited thereto.

The TFT member 20 may include a first TFT 22 and a second TFT 24 that may be stacked in sequence from the bottom, and the TFT member 20 may further include an insulating layer 26 disposed between the first TFT 22 and the second TFT 24.

Each of the first TFT 22 and the second TFT 24 may include an organic semiconductor or an inorganic semiconductor. The first TFT 22 and the second TFT 24 may be connected to or disconnected from each other. Although FIG. 1 shows that the first TFT 22 and the second TFT 24 are aligned with each other in a vertical direction, the first TFT 22 and the second TFT 24 may not be aligned with each other.

The insulating layer 26 may electrically insulate the first TFT 22 and the second TFT 24 from each other, and may include an organic insulating material or an inorganic insulating material. When the first TFT 22 and the second TFT 24 are connected to each other, the insulating layer 26 may have a hole through which the first TFT 22 and the second TFT 24 are connected to each other.

The display member 30 may be configured to display images, and may include a first electrode 32, a second electrode 34, and a display layer 36, e.g., organic light emitting layer. The first electrode 32 and the second electrode 34 may face each other, and the display layer 36 may be disposed between the first electrode 32 and the second electrode 34.

Each of the first electrode 32 and the second electrode 34 may include a transparent conductive material, for example, indium tin oxide (ITO) and zinc tin oxide (IZO). However, materials for the first electrode 32 and the second electrode 34 are not limited thereto. According to example embodiments, at least one of the first electrode 32 and the second electrode 34 may include an opaque conductive material.

The first electrode 32 may be connected to at least one of the first TFT 22 and the second TFT 24. According to example embodiments, the first electrode 32 may be an extension of an electrode (not shown) of the second TFT 24.

A material for the display layer 36 may be different for different types of the display device 1. For example, the display layer 36 for an organic light emitting display may include an organic light emitting material, and the display layer 36 for a liquid crystal display may include a liquid crystal layer.

The TFT member 20 and the display member 30 may be aligned with each other or may not be aligned with each other.

Example embodiments of the TFT member 20 are described in detail with reference to FIG. 2 to FIG. 5. FIG. 2 to FIG. 5 are schematic sectional views of a TFT member for a display device according to example embodiments.

Figure 2:
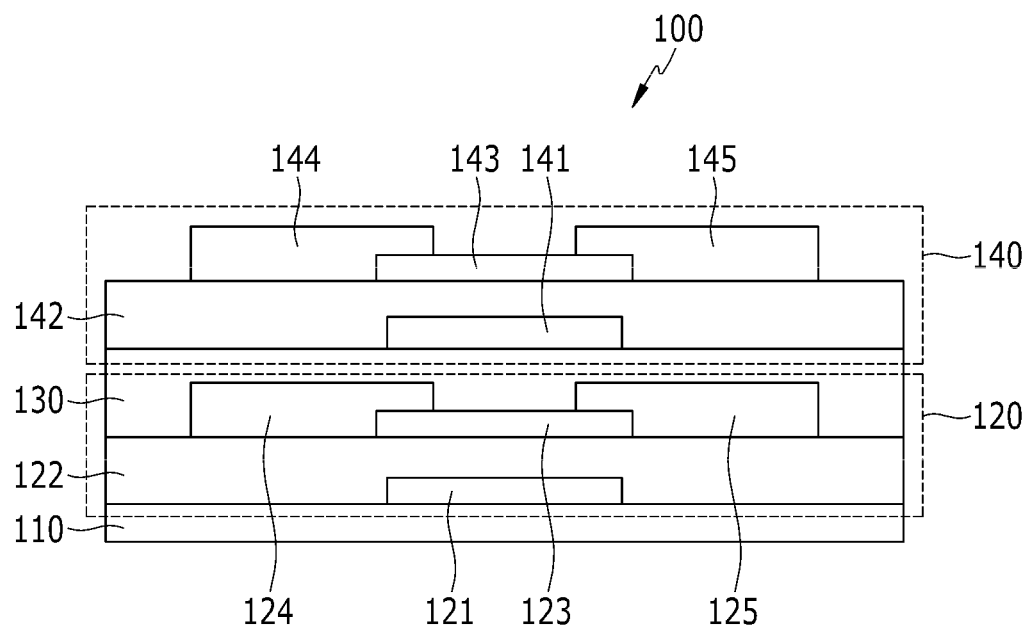
FIG. 2 to FIG. 5 are schematic sectional views of a TFT member for a display device according to example embodiments.

Referring to FIG. 2, a TFT member 100 according to an example embodiment may include a first TFT 120 and a second TFT 140 disposed on the first TFT 120.

For example, a first gate electrode 121 may be disposed on a substrate 110, and a first gate insulating layer 122 may be disposed on the first gate electrode 121. A first semiconductor member 123 may be disposed on the first gate insulating layer 122, and a first source electrode 124 and a first drain electrode 125 spaced apart from each other may be disposed on the first semiconductor member 123. The first gate electrode 121, the first gate insulating layer 122, the first semiconductor member 123, the first source electrode 124, and the first drain electrode 125 may form the first TFT 120.

An insulation layer or a passivation layer 130 may be disposed on the first TFT 120.

A second gate electrode 141 may be disposed on the passivation layer 130, and the second gate insulating layer 142 may be disposed on the second gate electrode 141. A second semiconductor member 143 may be disposed on the second gate insulating layer 142, and a second source electrode 144 and a second drain electrode 145 spaced apart from each other may be disposed on the second semiconductor member 143. The second gate electrode 141, the second gate insulating layer 142, the second semiconductor member 143, the second source electrode 144, and the second drain electrode 145 may form the second TFT 140.

Each of the first TFT 120 and the second TFT 140 shown in FIG. 2 may be a bottom-gate type TFT where the gate electrode 121 or 141 is disposed under the semiconductor member 123 or 143.

The substrate 110 may include a metal or a transparent insulating material, for example, a plastic, glass, and quartz. According to example embodiments, the substrate 10 may include a flexible material, e.g., a plastic. An example of the metal may include a metal, e.g., steel use stainless (SUS). Examples of the plastic may include polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), triacetyl cellulose (TAC), and cellulose acetate propinonate (CAP). However, a material for the substrate 110 is not limited thereto.

The first gate electrode 121 and the second gate electrode 141 may include a conductive organic material or a conductive inorganic material, for example, gold (Au), silver (Ag), nickel (Ni), indium tin oxide (ITO), aluminum (Al), and chromium (Cr). However, a material for the first gate electrode 121 and the second gate electrode 141 is not limited thereto.

Each of the first gate insulating layer 122, the second gate insulating layer 142, and the passivation layer 130 may include at least one of an organic insulating material and an inorganic insulating material, and may have a single-layered structure or a multilayered structure. Examples of the inorganic insulating material may include $SiO_2$, $SiN_x$, $Al_2O_3$, $Ta_2O_5$, barium strontium titanate (BST), and lead zirconate titanate (PZT). Examples of the organic insulating material may include polystyrene (PS), a phenolic polymer, an acrylic polymer, an imide-based polymer, e.g., polyimide, an aryl ether based polymer, an amide-based polymer, a fluorine-based polymer, a p-xylylene-based polymer, a vinyl alcohol based polymer, and parylene. However, a material for the first gate insulating layer 122, the second gate insulating layer 142, and the passivation layer 130 is not limited thereto.

Each of the first semiconductor member 123 and the second semiconductor member 143 may include an organic semiconductor or an inorganic semiconductor, of N-type or P-type. Examples of the organic semiconductor may include pentacene, tetracene, anthracene, naphthalene, α-6-thiophene, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, poly(para-perylene vinylene) and a derivative thereof, polyfluorene and a derivative thereof, poly thiophene vinylene and a derivative thereof, poly(para-phenylene) and a derivative thereof, a polythiophene-heteroaromatic copolymer and a derivative thereof, an oligoacene of naphthalene and a derivative thereof, an oligothiophene of α-5-thiophene and a derivative thereof, phthalocyanine with or without a metal and a derivative thereof, pyromellitic dianhydride and a derivative thereof, pyromellitic diimide and a derivative thereof, naphthalene tetracarboxylic diimide and a derivative thereof, and naphthalene tetracarboxylic dianhydride and a derivative thereof. Examples of the inorganic semiconductor may include amorphous silicon, polysilicon, and an oxide semiconductor. However, a material for the first semiconductor member 123 and the second semiconductor member 143 is not limited thereto.

Each of the first source electrode 124, the second source electrode 144, the first drain electrode 125, and the second drain electrode 145 may include a conductive organic material or a conductive inorganic material. Examples of the conductive organic material may include gold (Au), silver (Ag), nickel (Ni), indium tin oxide (ITO), and chromium (Cr). However, a material for the first source electrode 124, the second source electrode 144, the first drain electrode 125, and the second drain electrode 145 is not limited thereto.

Figure 3:
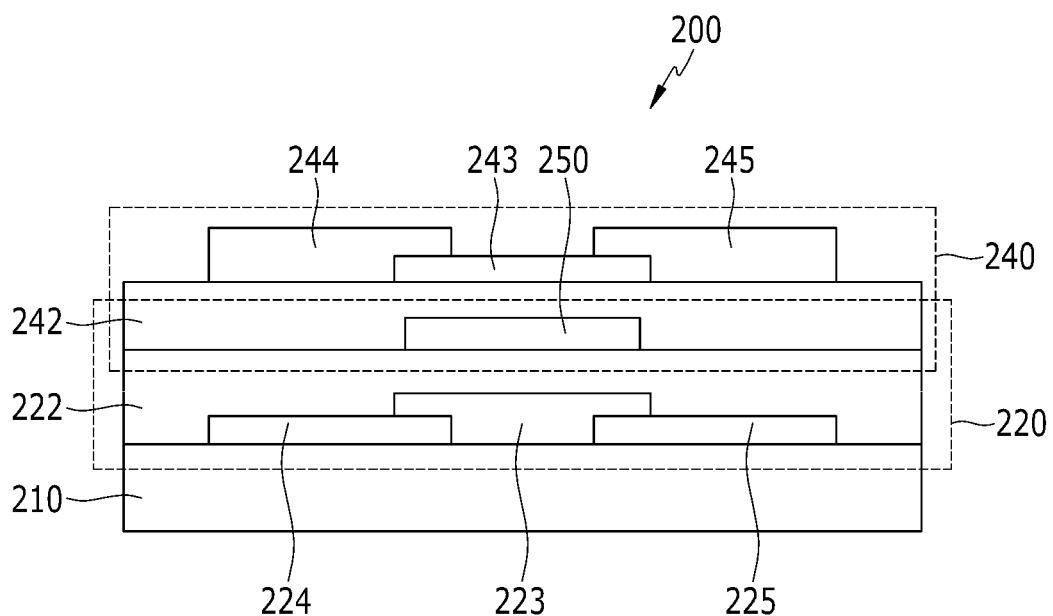

Referring to FIG. 3, a TFT member 200 according to an example embodiment may include a first TFT 220 and a second TFT 240 disposed on the first TFT 120 like the TFT member 100 shown in FIG. 2. However, the first TFT 220 is a top gate type TFT while the second TFT 240 is a bottom gate type TFT.

For example, a first source electrode 224 and a first drain electrode 225 spaced apart from each other may be disposed on the substrate 210. A first semiconductor member 223 may be disposed on portions of the first source electrode 224 and the first drain electrode 225 and on a portion of the substrate 210 between the first source electrode 224 and the first drain electrode 225. A first gate insulating layer 222 may be disposed on the first semiconductor member 223, the first source electrode 224, and the first drain electrode 225.

A common gate electrode 250 may be disposed on the first gate insulating layer 222.

A second gate insulating layer 242 may be disposed on the gate electrode 250. A second semiconductor member 243 may be disposed on the second gate insulating layer 242, and a second source electrode 244 and the second drain electrode 245 spaced apart from each other may be disposed on the second semiconductor member 243.

In example embodiments, the first TFT 220 and the second TFT 240 may share the gate electrode 250. For example, the gate electrode 250, the first gate insulating layer 222, the first semiconductor member 223, the first source electrode 224, and the first drain electrode 225 may form the first TFT 220, and the gate electrode 250, the second gate insulating layer 242, the second semiconductor member 243, the second source electrode 244, and the second drain electrode 245 may form the second TFT 240.

Figure 4:
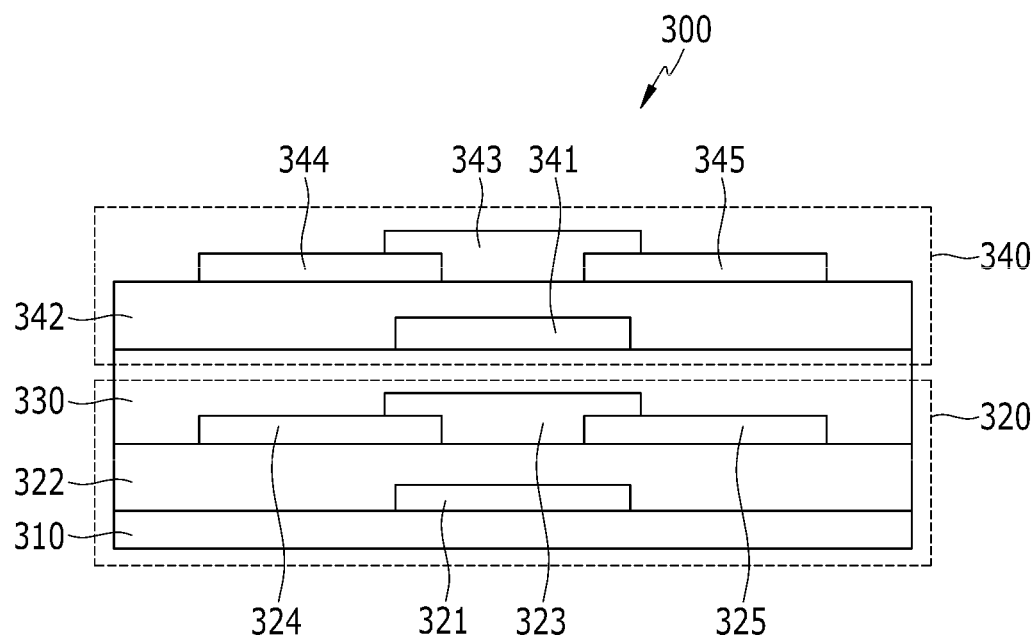

Referring to FIG. 4, a TFT member 300 according to an example embodiment may include a first TFT 320 and a second TFT 340 disposed on the first TFT 120 like the TFT member 100 shown in FIG. 2.

For example, a first gate electrode 321 may be disposed on a substrate 310, and a first gate insulating layer 322 may be disposed on the first gate electrode 321. A first source electrode 324 and a first drain electrode 325 spaced apart from each other may be disposed on the first gate insulating layer 322, and a first semiconductor member 323 may be disposed on portions of the first source electrode 324 and the first drain electrode 325 and on a portion of the first gate insulating layer 322 between the first source electrode 324 and the first drain electrode 325. The first gate electrode 321, the first gate insulating layer 322, the first semiconductor member 323, the first source electrode 324, and the first drain electrode 325 may form the first TFT 320.

An insulation layer or a passivation layer 330 may be disposed on the first TFT 320.

A second source electrode 344 and a second drain electrode 345 spaced apart from each other may be disposed on the passivation layer 330. A second semiconductor member 343 may be disposed on portions of the second source electrode 344 and the second drain electrode 345 and on a portion of the passivation layer 330 between the second source electrode 344 and the second drain electrode 345. The second gate electrode 341, the second gate insulating layer 342, the second semiconductor member 343, the second source electrode 344, and the second drain electrode 345 may form the second TFT 340.

The vertical positions of the source and drain electrodes 324, 325, 344 and 345 may be exchanged with the vertical positions of the semiconductor members 323 and 343 in this example embodiment compared with those shown in FIG. 2.

Figure 5:
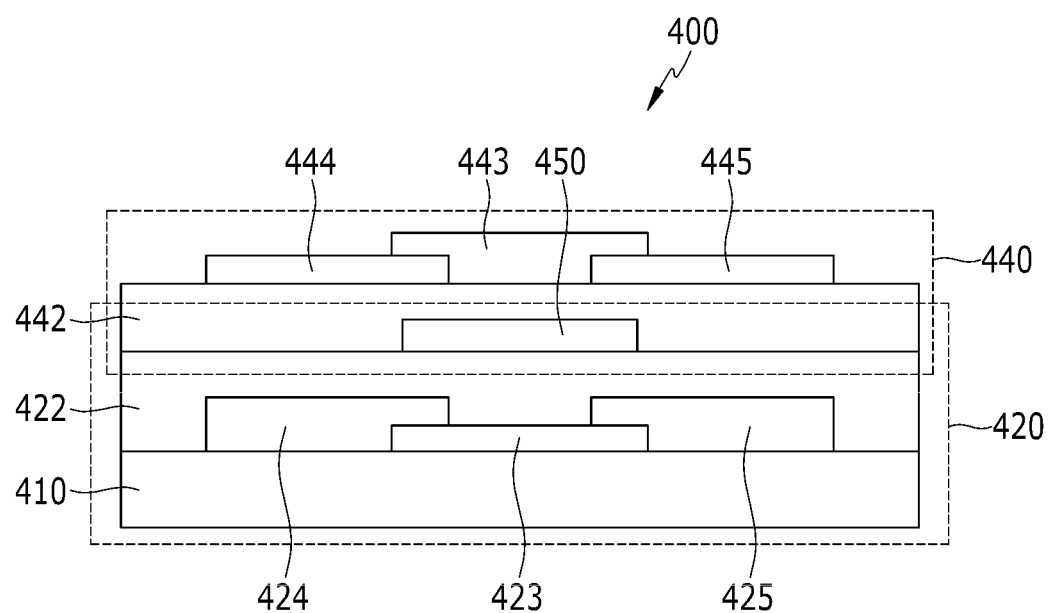

Referring to FIG. 5, a TFT member 400 according to an example embodiment may include a first TFT 420 and a second TFT 440 disposed on the first TFT 420.

For example, a first semiconductor member 423 may be disposed on the substrate 410, and a first source electrode 424 and a first drain electrode 425 spaced apart from each other may be disposed on the first semiconductor member 423. A first gate insulating layer 422 may be disposed on the first semiconductor member 423, the first source electrode 424, and the first drain electrode 425.

A common gate electrode 450 may be disposed on the first gate insulating layer 422.

A second gate insulating layer 442 may be disposed on the gate electrode 450. A second source electrode 444 and the second drain electrode 445 spaced apart from each other may be disposed on the second gate insulating layer 442. second semiconductor member 443 may be disposed on portions of the second source electrode 444 and the second drain electrode 445 and on a portion of the second gate insulating layer 442 330 between the second source electrode 444 and the second drain electrode 445.

In example embodiments, the first TFT 420 and the second TFT 440 may share the gate electrode 450. For example, the gate electrode 450, the first gate insulating layer 422, the first semiconductor member 423, the first source electrode 424, and the first drain electrode 425 may form the first TFT 420, and the gate electrode 450, the second gate insulating layer 442, the second semiconductor member 443, the second source electrode 444, and the second drain electrode 445 may form the second TFT 440.

The vertical positions of the source and drain electrodes 424, 425, 444 and 445 may be exchanged with the vertical positions of the semiconductor members 423 and 443 in this example embodiment compared with those shown in FIG. 3.

A TFT member according to example embodiments may have various structures in addition to the structures shown in FIG. 2 to FIG. 5. For example, vertical positions of source and drain electrodes may be exchanged with semiconductor members, and a first TFT and a second TFT may share a common gate electrode or may include respective gate electrodes.

The materials for portions of the TFT member 300, 400 or 500 shown in FIG. 3 to FIG. 5 may be the same as those described above with reference to FIG. 2.

A pixel of an organic light emitting display including a structure shown in FIG. 1 to FIG. 5 according to example embodiments is described in detail with reference to FIG. 6 and FIG. 7.

Figure 6:
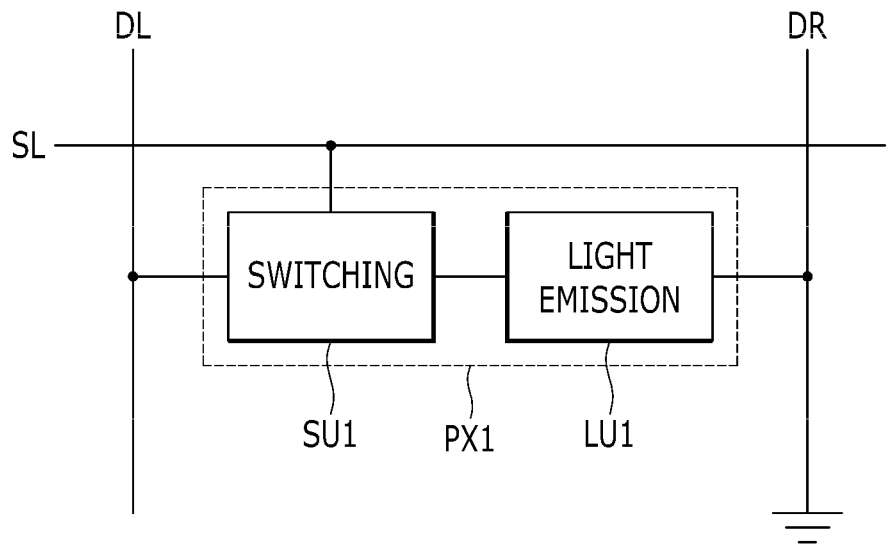
FIG. 6 is a block diagram of a pixel in an organic light emitting display according to example embodiments.
Figure 7:
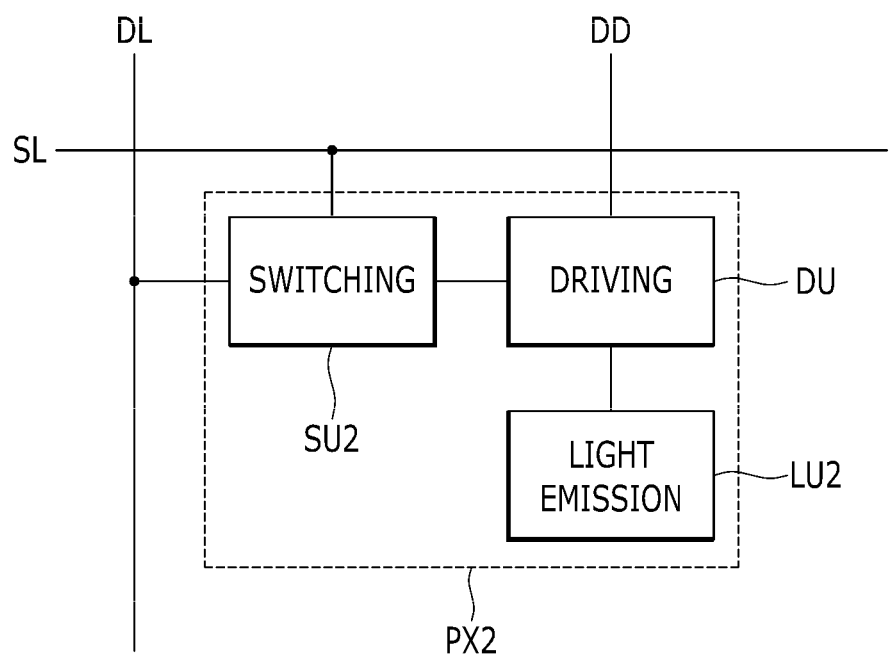
FIG. 7 is a block diagram of a pixel in an organic light emitting display according to example embodiments.

FIG. 6 is a block diagram of a pixel in an organic light emitting display according to example embodiments, and FIG. 7 is a block diagram of a pixel in an organic light emitting display according to example embodiments.

Referring to FIG. 6, an organic light emitting display according to example embodiments may include a pixel PX1, a scanning line SL, a data line DL, and a drain line DR. The pixel PX1 may include a switching unit SU1 and a light emitting unit LU1. The switching unit SU1 may be connected to the scanning line SL and the data line DL, and the light emitting unit LU1 may be connected to the switching unit SU1 and the drain line DR.

The switching unit SU1 may include a first TFT and a second TFT, which are described above with reference to FIG. 1 to FIG. 5, and the light emitting unit LU1 may include a display member described above with reference to FIG. 1.

In the organic light emitting display, a TFT of the switching unit SU1 may turn on in response to a scanning signal from the scanning line SL to transmit an image signal from the data line DL to the light emitting unit LU1. The light emitting unit LU1 may convert the image signal into light to be emitted. The image signal input into the light emitting unit LU1 may be a current signal.

Referring to FIG. 7, an organic light emitting display according to example embodiments may include a pixel PX2, a scanning line SL, a data line DL, and a supply voltage line DD. The pixel PX2 may include a switching unit SU2, a driving unit DU, and a light emitting unit LU2. The switching unit SU2 may be connected to the scanning line SL and the data line DL, and the driving unit DU may be connected to the switching unit SU2 and the supply voltage line DD. The light emitting unit LU2 may be connected to the driving unit DU.

At least one of the switching unit SU2 and the driving unit DU may include a first TFT and a second TFT, which are described above with reference to FIG. 1 to FIG. For example, the switching unit SU2 may include the first TFT, and the driving unit DU may include the second TFT. On the contrary, the switching unit SU2 may include the second TFT, and the driving unit DU may include the first TFT. According to example embodiments, one of the switching unit SU2 and the driving unit DU may include both the first TFT and the second TFT.

In the organic light emitting display, a TFT of the switching unit SU2 may turn on in response to a scanning signal from the scanning line SL to transmit an image signal from the data line DL to the driving unit DU. A TFT of the driving unit DU may turn on based on the image signal to generate and transmit a current having a magnitude corresponding to the image signal to the light emitting unit LU2. The light emitting unit LU2 may emit light with an intensity varying based on the magnitude of the current. The image signal may be a voltage signal.

While some example embodiments have been particularly shown and described, it will be understood by one of ordinary skill in the art that variations in form and detail may be made therein without departing from the spirit and scope of the claims.

What is claimed is:

1. A display device comprising:
   a first thin film transistor on a substrate;
   a second thin film transistor on the first thin film transistor; and
   a display unit electrically connected to at least one of the first thin film transistor and the second thin film transistor,
   wherein at least one of the first thin film transistor and the second thin film transistor includes one of an N-type and P-type organic semiconductor.

2. The display device of claim 1, further comprising:
   an insulating layer between the first thin film transistor and the second thin film transistor.

3. The display device of claim 2, wherein the first thin film transistor comprises:
 a first gate electrode on the substrate;
 a first gate insulating layer on the first gate electrode;
 a first semiconductor member on the first gate insulating layer; and
 a first source electrode and a first drain electrode on or under the first semiconductor member, the first source electrode and the first drain electrode spaced apart from each other.

4. The display device of claim 3, wherein the second thin film transistor comprises:
 a second gate electrode on the insulating layer;
 a second gate insulating layer on the second gate electrode;
 a second semiconductor member on the second gate insulating layer; and
 a second source electrode and a second drain electrode on or under the second semiconductor member, the second source electrode and the second drain electrode spaced apart from each other.

5. The display device of claim 1, wherein the first thin film transistor and the second thin film transistor include a gate electrode in common, and the first thin film transistor further comprises:
 a first semiconductor member on the substrate;
 a first source electrode and a first drain electrode on or under the first semiconductor member, the first source electrode and the first drain electrode spaced apart from each other; and
 a first gate insulating layer under the gate electrode and on the first semiconductor member, the first source electrode, and the first drain electrode.

6. The display device of claim 5, wherein the second thin film transistor further comprises:
 a second gate insulating layer on the gate electrode;
 a second semiconductor member on the second gate insulating layer;
 a second source electrode and a second drain electrode on or under the second semiconductor member, the second source electrode and the second drain electrode are spaced apart from each other.

7. The display device of claim 1, wherein the display unit further comprises an organic light emitting layer between two electrodes.

8. The display device of claim 1, wherein the one of the N-type and P-type organic semiconductor includes one of pentacene, tetracene, anthracene, naphthalene, $\alpha$-6-thiophene, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, poly(para-perylene vinylene) and a derivative thereof, polyfluorene and a derivative thereof, poly thiophene vinylene and a derivative thereof, poly(para-phenylene) and a derivative thereof, a polythiophene-heteroaromatic copolymer and a derivative thereof, an oligoacene of naphthalene and a derivative thereof, an oligothiophene of $\alpha$-5-thiophene and a derivative thereof, phthalocyanine with or without a metal and a derivative thereof, pyromellitic dianhydride and a derivative thereof, pyromellitic diimide and a derivative thereof, naphthalene tetracarboxylic diimide and a derivative thereof, and naphthalene tetracarboxylic dianhydride and a derivative thereof.

* * * * *